United States Patent
Jang et al.

(10) Patent No.: US 8,102,209 B2
(45) Date of Patent: Jan. 24, 2012

(54) CMOS VARIABLE GAIN AMPLIFIER

(75) Inventors: Seunghyun Jang, Daejeon (KR); Kwang-Chun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/878,307

(22) Filed: Sep. 9, 2010

(65) Prior Publication Data

US 2011/0063030 A1   Mar. 17, 2011

(30) Foreign Application Priority Data

Sep. 11, 2009   (KR) .................. 10-2009-0086010

(51) Int. Cl.
*H03F 3/45*   (2006.01)
(52) U.S. Cl. ..................... 330/254; 330/261
(58) Field of Classification Search ............ 330/253, 330/254, 261
See application file for complete search history.

(56) References Cited

U.S. PATENT DOCUMENTS

| | | | | |
|---|---|---|---|---|
| 7,046,089 B2 * | 5/2006 | Kwon et al. | ............... | 330/254 |
| 7,701,289 B2 * | 4/2010 | Kuo et al. | ............... | 330/254 |
| 2011/0095822 A1 * | 4/2011 | Chan | ............... | 330/254 |

OTHER PUBLICATIONS

Hui Dong Lee et al., "A Wideband Linear-In-dB VGA Using a CMOS in The Triode Region", Microwave and Optical Technology Letters, vol. 48, No. 5, pp. 997-1000, Nov. 16, 2005.
John M. Khoury, "On the Design of Constant Settling Time AGC Circuits", IEEE Transactions on Circuits and Systems-II, vol. 45, No. 3, Mar. 1998, pp. 283-294.

* cited by examiner

*Primary Examiner* — Henry Choe
(74) *Attorney, Agent, or Firm* — Rabin & Berdo, P.C.

(57) ABSTRACT

A complementary metal-oxide semiconductor (CMOS) variable gain amplifier includes: a cascode amplifier including a common source field effect transistor and a common gate field effect transistor in a cascode structure; a first current generation unit connected in parallel to a drain of the common gate field effect transistor and configured to vary transconductance of the cascode amplifier; a second current generation unit connected to a common source of the cascode amplifier and configured to control a bias current of the cascode amplifier; a current control unit configured to generate a current control signal for the first and second current generation units; and a load stage connected in series to a drain of the cascode amplifier and configured to output an output current, which is varied by the overall transconductance of the cascode amplifier, as a differential output voltage.

14 Claims, 4 Drawing Sheets

CMOS VARIABLE GAIN AMPLIFIER

CROSS-REFERENCE(S) TO RELATED APPLICATIONS

The present application claims priority of Korean Patent Application No. 10-2009-0086010, filed on Sep. 11, 2009, which is incorporated herein by reference in its entirety.

BACKGROUND OF THE INVENTION

1. Field of the Invention

Exemplary embodiments of the present invention relate to a variable gain amplifier; and, more particularly, to a complementary metal-oxide semiconductor (CMOS) variable gain amplifier which has a wide linear-in-dB variable gain range to process an input signal having a wide range of magnitudes.

2. Description of Related Art

In a general communication system, a signal outputted from a transmitter is inputted to a receiver through a communication channel having various attenuation characteristics. At this time, in order to restore information transmitted from the transmitter from the inputted signal having a wide range of magnitudes, a process of controlling the inputted signal to a constant magnitude is required in the receiver. A function performed in such a process is referred to as an automatic gain control (AGC) function. A variable gain amplifier serves as a core block for realizing the AGC function. According to a paper published by John M. Khoury, "On the Design of Constant Settling Time AGC circuits", IEEE Transactions on Circuits and Systems-II, vol. 45, No. 3, March 1998, pp. 283-294, the variable gain amplifier should have a linear-in-dB gain characteristic with respect to a variation in an inputted control signal, in order to obtain a constant settling time for input signals having a wide range of magnitudes in an AGC device.

Therefore, the gain variation range of the variable gain amplifier which may be used in the AGC device is limited to a linear-in-dB gain period. Accordingly, there is demand for the research and development of a CMOS variable gain amplifier having as wide a range of linear-in-dB gain characteristics as possible with respect to the variation of a control signal.

As demand for the CMOS variable gain amplifier having a wide range of linear-in-dB gain characteristics has increased, a communication system has been proposed. The communication system separately includes a converter configured to convert a control signal of which the magnitude is linearly varied into an exponential signal to exhibit the linear-in-dB gain characteristics, and then uses the exponential signal as a gain control signal of the variable control amplifier.

However, since a receiver of the communication system using the variable gain amplifier should additionally include the exponential signal converter configured to generate a linear-in-dB gain control signal in addition to the variable gain amplifier, it is difficult to implement a device having a low power consumption and a small integrated area.

SUMMARY OF THE INVENTION

An embodiment of the present invention is directed to a CMOS variable gain amplifier which has a wide range of linear-in-dB gain characteristics without a converter which converts a gain control signal of which the gain characteristic is linearly varied into an exponential signal.

Another embodiment of the present invention is directed to a CMOS variable gain amplifier which operates at a low power while having a wide range of linear-in-dB gain characteristics.

Another embodiment of the present invention is directed to a CMOS variable gain amplifier which occupies a small integrated area while having a wide range of linear-in-dB gain characteristics and operating at a low power.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a CMOS variable gain amplifier includes: a cascode amplifier including a common source field effect transistor and a common gate field effect transistor which are connected in a cascode structure; a first current generation unit connected in parallel to a drain of the common gate field effect transistor and configured to vary transconductance of the cascode amplifier in accordance with a gain control voltage signal applied to a gate of the common gate field effect transistor of the cascode amplifier; a second current generation unit connected to a common source of the cascode amplifier and configured to control a bias current of the cascode amplifier in accordance with the gain control voltage signal; a current control unit configured to generate a current control signal for the first and second current generation units in accordance with the gain control voltage signal; and a load stage connected in series to a drain of the cascode amplifier and configured to output an output current, which is varied by the overall transconductance of the cascode amplifier, as a differential output voltage.

DESCRIPTION OF SPECIFIC EMBODIMENTS

Figure 1:
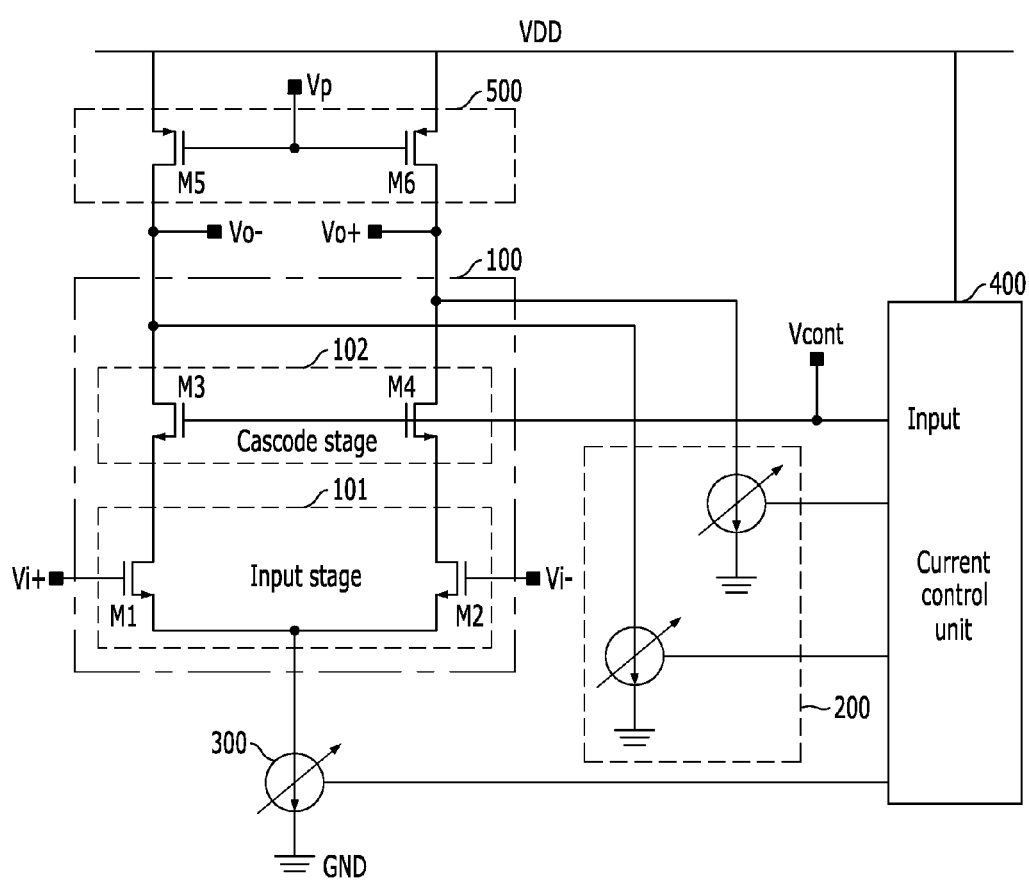
FIG. 1 is a circuit diagram illustrating a CMOS variable gain amplifier in accordance with an embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a circuit diagram illustrating a CMOS variable gain amplifier in accordance with an embodiment of the present invention. Referring to FIG. 1, the CMOS variable gain amplifier in accordance with the embodiment of the present invention includes a cascode amplifier 100, a first current generation unit 200, a second current generation unit 300, a current control unit 400, and a load stage 500. The cascode amplifier 100 includes a common source field effect transistor and a common gate field effect transistor, which are connected in a cascode form. The first current generation unit 200 is connected in parallel to the cascode amplifier 100. The second current generation unit 300 is connected to a common source of the cascode amplifier 100. The current control unit 400 is configured to apply a signal for controlling currents of the first and second current generation units 200 and 300. The load stage 500 is connected in series to the cascode amplifier 100 to output a differential output voltage.

The cascode amplifier 100 includes an input stage 101 into which input voltage signals Vi+ and Vi− are differentially inputted in a triode region, and is configured to change transconductance of the input stage 101 in accordance with a gain control voltage signal Vcont which is applied as a common gate voltage of a cascode stage 102.

The first current generation unit 200 connected in parallel to the cascode stage 102 of the cascode amplifier 100 is configured to vary a flowing current in accordance with the gain control voltage signal Vcont which is a common gate voltage of the cascode stage 102 and control a current flowing into the cascode stage 102 to change transconductance of the cascode stage 102.

The second current generation unit 300 connected to the common source of the input stage 101 of the cascode amplifier 100 is configured to vary a flowing current in accordance with the gain control voltage signal Vcont which is a common gate voltage of the cascode stage 102 of the cascode amplifier 100 and control a bias current flowing in the cascode amplifier 100.

The current control unit 400 is configured to receive the gain control voltage signal Vcont which is a common gate voltage of the cascode stage 102 of the cascode amplifier 100, and generate a current control signal for the first and second current generation units 200 and 300.

The load stage 500 connected in series to the cascode stage 102 of the cascode amplifier 100 is configured to output an output current, which is varied by the overall transconductance of the cascode amplifier 100, as a differential output voltage by using a resistance load or active load.

The operation of the CMOS variable gain amplifier configured in such a manner will be described in more detail as follows.

First, when the first and second input voltage signals Vi+ and Vi− inputted from outside are differentially inputted to the input stage 101 of the cascode amplifier 100, the first and second input voltage signals Vi+ and Vi− obtain a gain corresponding to the overall transconductance of the cascode amplifier 100, and then flow into drain of field effect transistors M3 and M4 inside the cascode stage 102 of the cascode amplifier 100 in the form of differential currents. At this time, while the field effect transistors M3 and M4 inside the cascode stage 102 operate in a saturation region, field effect transistors M1 and M2 inside the input stage 101 operate in a triode region, because the common gate voltage of the cascode stage 102 as the gain control voltage is sufficiently decreased.

In the above-described configuration, the overall transconductance of the cascode amplifier 100 may be expressed as Equation 1 below.

$$G_m = \frac{g_{m1,2}}{1 + \frac{g_{ds1,2}}{g_{m3,4}}} \quad \text{Eq. 1}$$

At this time, the field effect transistors M1 and M2 inside the input stage 101 of the cascode amplifier 100 operate in the triode region. Therefore, $g_{m1,2}$ and $g_{ds1,2}$ may be expressed as Equations 2 and 3 below.

$$g_{m1,2} = \mu_N C_{OX}\left(\frac{W}{L}\right) V_{DS1,2} \quad \text{Eq. 2}$$

$$g_{ds1,2} = \mu_N C_{OX}\left(\frac{W}{L}\right)(V_{GS1,2} - V_{THV1,2}) \quad \text{Eq. 3}$$

On the other hand, the field effect transistors M3 and M4 inside the cascode stage 102 of the cascode amplifier 100 operate in the saturation region. Therefore, $g_{m3,4}$ may be expressed as Equation 4 below.

$$g_{m3,4} = \sqrt{2\mu_N C_{OX}\left(\frac{W}{L}\right) I_{D3,4}} \quad \text{Eq. 4}$$

Meanwhile, when the gain of the CMOS variable gain amplifier is exponentially varied while the gain control voltage is linearly varied, the CMOS variable gain amplifier may exhibit a linear-in-dB gain characteristic with respect to the gain control voltage. In order to create such an exponential function, the exponential function may be approximated and expressed as Equation 5 below.

$$e^{2ax} = \frac{e^{ax}}{e^{-ax}} \cong \frac{1 + ax}{1 - ax} \quad \text{Eq. 5}$$

That is, a function in which a numerator term increases as much as ax and a denominator term decreases as much as ax with respect an input x may be created. Then, this function is approximated to the exponential function.

Referring to Equation 5, Equation 1 for calculating the transconductance of the cascode amplifier 100 may be examined as follows. Since $g_{m1,2}$ has a larger value than $g_{ds1,2}$ in most cases, the numerator and denominator terms of Equation 1 have values varying in the opposite direction with respect to an input signal, when a peripheral circuit is used to operate the cascode amplifier 100 in accordance with Table 1. Therefore, the gain of the CMOS variable gain amplifier has a characteristic approximate to the exponential function.

TABLE 1

| | Gain control voltage (Vcont) | | | |
|---|---|---|---|---|
| | $g_{m1,2}$ | $g_{ds1,2}$ | $g_{m3,4}$ | |
| Increase | Increase | Decrease | Increase | |
| Decrease | Decrease | Increase | Decrease | |

The operation process of the cascode amplifier 100 operating in accordance with Table 1 will be described in more detail as follows. When the gain control voltage Vcont inputted to the common gate of the cascode stage 102 increases, source voltages of the field effect transistors M3 and M4 inside the cascode stage 102 increase. Accordingly, drain voltages of the field effect transistors M1 and M2 inside the input stage 101 increase, and $g_{m1,2}$ increases in accordance with Equation 2.

At this time, a bias current applied to the common source of the input stage 101 of the cascode amplifier 100 is decided by the second current generation unit 300. Therefore, an additional increase in the bias current caused by the increase in the drain voltages of the field effect transistors M1 and M2 inside the input stage 101 does not occur, and source voltages of the field effect transistors M1 and M2 increase. However, since the source voltages do not increase as much as the increase in the drain voltages of the field effect transistors M1 and M2, the increase of $g_{m1,2}$ depending on the increase in the gain control voltage Vcont is effective.

Furthermore, since $V_{GS1,2}$ is decreased by the increase in the source voltages of the field effect transistors M1 and M2 inside the input stage 101 of the cascode amplifier 100, $g_{ds1,2}$ decreases in accordance with Equation 3. Furthermore, when the current control unit 400 receives the increasing gain control voltage Vcont and generates a current control signal in a direction where the current of the first current generation unit 200 is decreased, $g_{m3,4}$ increases in accordance with Equation 4. At this time, when the current control unit 400 generates a current control signal such that the second current generation unit 300 providing a bias current to the cascode amplifier 100 has a current increase characteristic with respect to the current decrease of the first current generation unit 200, it is possible to obtain a larger transconductance variation in the cascode amplifier 100.

On the other hand, when the gain control voltage Vcont decreases, the source voltages of the field effect transistors M3 and M4 inside cascode stage 102 of the cascode amplifier 100 decrease, and the drain voltages of the field effect transistors M1 and M2 inside the input stage 101 decrease. Then, $g_{m1,2}$ decreases in accordance with Equation 2. At this time, since the bias current of the cascode amplifier 100 is decided by the second current generation unit 300, an additional decrease of the bias current caused by the decrease in the drain voltages of the field effect transistors M1 and M2 inside the input stage 101 of the cascode amplifier 100 does not occur. Accordingly, the source voltages of the field effect transistors M1 and M2 decrease.

However, since the source voltages do not decrease as much as the decrease in the drain voltages of the field effect transistors M1 and M2, the decrease of $g_{m1,2}$ depending on the decrease in the gain control voltage Vcont is effective. Furthermore, since $V_{GS1,2}$ is increased by the decrease in the source voltages of the field effect transistors M1 and M2 inside the input stage 101, $g_{ds1,2}$ increases in accordance with Equation 3. Furthermore, when the current control unit 400 receives the decreasing gain control voltage Vcont and generates a current control signal in a direction where the current of the first current generation unit 200 is increased, $g_{m3,4}$ decreases in accordance with Equation 4. At this time, when the current control unit 400 generates a current control signal such that the second current generation unit 300 providing a bias current to the cascode amplifier 100 has a current decrease characteristic with respect to the current increase of the first current generation unit 200, it is possible to obtain a larger transconductance variation in the cascode amplifier.

Finally, the differential input signals Vi+ and Vi− of the input stage 101 obtaining a gain corresponding to the transconductance of the cascode amplifier 100, which is decided by Equation 5, are converted into a current form, and then outputted as differential output voltages Vo+ and Vo− by the resistance load or active load inside the load stage 500.

Figure 2:
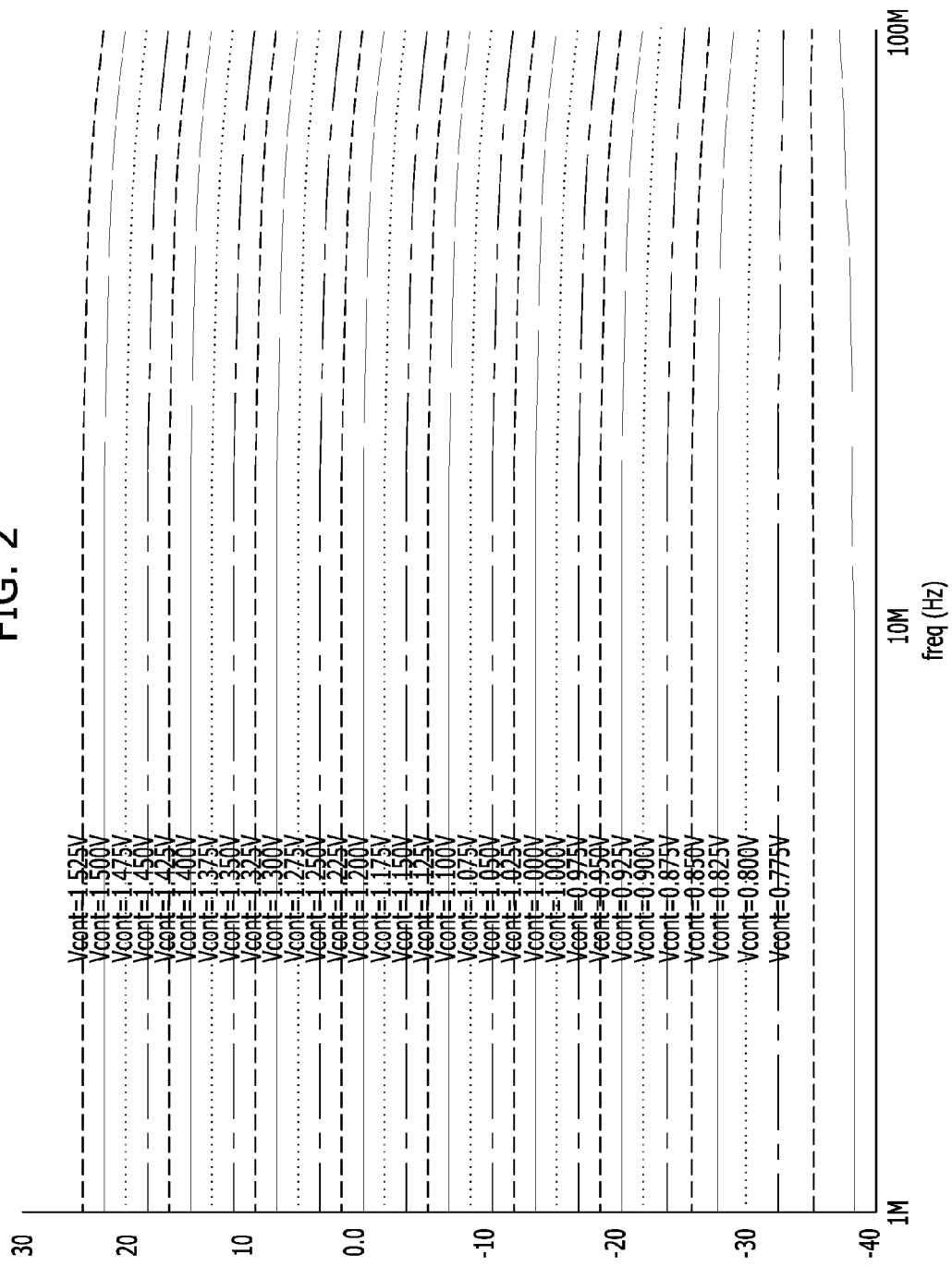
FIG. 2 is a graph showing gain variation characteristics on a frequency axis depending on a gain control voltage of the CMOS variable gain amplifier in accordance with the embodiment of the present invention.
Figure 3:
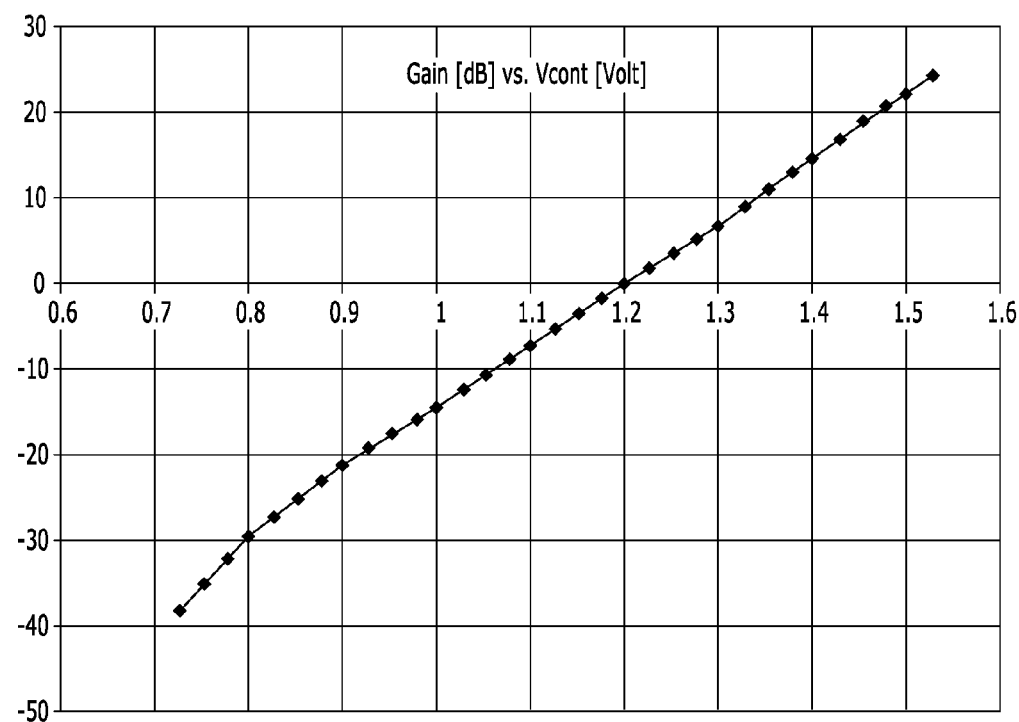
FIG. 3 is a graph showing gain variation characteristics depending on a gain control voltage at a frequency of 20 MHz in FIG. 2.

FIG. 2 is a graph showing gain variation characteristics on a frequency axis depending on the gain control voltage Vcont of the CMOS variable gain amplifier in accordance with the embodiment of the present invention. FIG. 3 is a graph showing gain variation characteristics depending on the gain control voltage Vcont at a frequency of 20 MHz in FIG. 2.

As the simulation results of FIGS. 2 and 3, the CMOS variable gain amplifier in accordance with the embodiment of the present invention exhibits a wide linear-in-dB gain characteristic of about 56.4 dB (−32.0 dB to +24.4 dB) within an error range of ±1 dB with respect to the gain control voltage Vcont which is linearly varied from 0.775 V to 1.525V.

Figure 4:
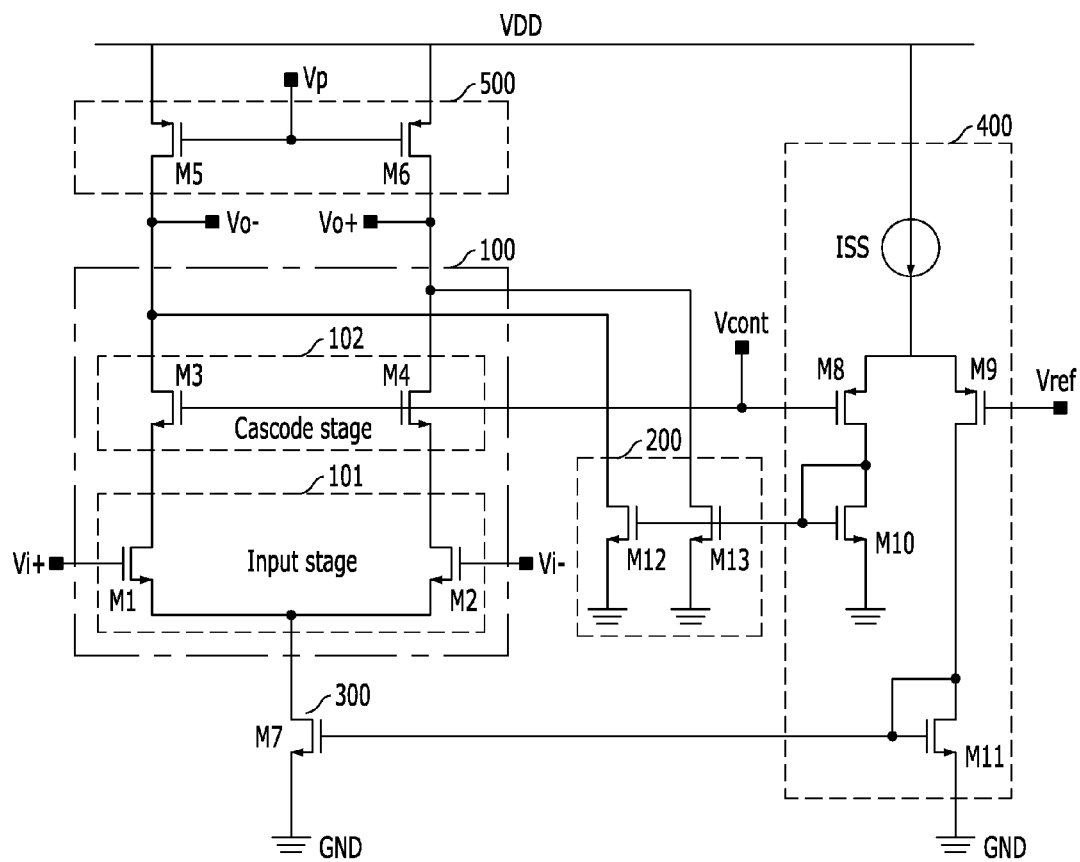
FIG. 4 is a circuit diagram illustrating a CMOS variable gain amplifier in accordance with another embodiment of the present invention.

FIG. 4 is a circuit diagram illustrating a CMOS variable gain amplifier in accordance with another embodiment of the present invention. The operation principle of the CMOS variable gain amplifier in accordance with the embodiment of the present invention is the same as that of the CMOS variable gain amplifier of FIG. 1. In this embodiment, the following descriptions will be focused on the first and second current generation units 200 and 300 and the current control unit 400 which provides a current control signal to the first and second current generation units 200 and 300.

Referring to FIG. 4, a case in which the gain control voltage Vcont increases will be first described. In this case, a gate voltage of a field effect transistor M8 inside the current control unit 400 increases, and a constant voltage Vref is applied to a gate of a field effect transistor M9 inside the current control unit 400. Therefore, the magnitude of a current flowing in the field effect transistor M8 decreases. Accordingly, a current mirror field effect transistor M10 decreases a current flowing in field effect transistors M12 and M13 inside the first current generation unit 200.

On the other hand, since the overall current flowing in the field effect transistors M8 and M9 should be identical to a source power supply current $I_{SS}$, the current of the field effect transistor M9 increases as much as the decrease in the current flowing in the field effect transistor M8. Accordingly, a current mirror field effect transistor M11 increases a current flowing in the field effect transistor M7 of the second current generation unit 300.

Therefore, when the gain control voltage Vcont increases as described above, the circuit of FIG. 4 transfers the current control signal based on the gain control voltage Vcont described in Table 1 to the first and second current generation units 200 and 300.

Referring to FIG. 4, a case in which the gain control voltage Vcont decreases will be described. In this case, the gate voltage of the field effect transistor M8 inside the current control unit 400 decreases, and the constant voltage Vref is applied to the gate of the field effect transistor M9. Therefore, the magnitude of the current flowing in the field effect transistor M8 increases. Accordingly, the current mirror field effect transistor M10 increases the current flowing in the field effect transistors M12 and M13 inside the first current generation unit 200.

On the other hand, since the overall current flowing in the field effect transistors M8 and M9 should be identical to the source power supply current $I_{SS}$, the current of the field effect transistor M9 decreases as much as the increase in the current flowing in the field effect transistor M8. Accordingly, the current mirror field effect transistor M11 decreases the current flowing in the field effect transistor M7 of the second current generation unit 300.

Therefore, when the gain control voltage Vcont decreases as described above, the circuit of FIG. 4 transfers the current control signal based on the gain control voltage Vcont described in Table 1 to the first and second current generation units 200 and 300.

As described above, the CMOS variable gain amplifier in accordance with the embodiment of the present invention exhibits a wide linear-in-dB gain characteristic with respect to the gain control voltage which is linearly varied. Therefore, it is possible to reduce the number of CMOS variable gain amplifiers required in an automatic gain controller inside a communication system which requires a low power consumption and a small occupied area.

Furthermore, the CMOS variable gain amplifier in accordance with the embodiment of the present invention does not need to include a converter which is used in an existing CMOS variable gain amplifier and converts a gain control signal of which the magnitude is linearly varied into an exponential signal to exhibit a linear-in-dB gain characteristic, but may realize the linear-in-dB gain characteristic by controlling the operation region of the field effect transistors of the CMOS variable gain amplifier and the current flowing in the field effect transistors.

While the present invention has been described with respect to the specific embodiments, it will be apparent to those skilled in the art that various changes and modifications may be made without departing from the spirit and scope of the invention as defined in the following claims.

What is claimed is:

1. A complementary metal-oxide semiconductor (CMOS) variable gain amplifier comprising:
   a cascode amplifier comprising a common source field effect transistor and a common gate field effect transistor which are connected in a cascode structure;
   a first current generation unit connected in parallel to a drain of the common gate field effect transistor and configured to vary transconductance of the cascode amplifier in accordance with a gain control voltage signal applied to a gate of the common gate field effect transistor of the cascode amplifier;
   a second current generation unit connected to a common source of the cascode amplifier and configured to control a bias current of the cascode amplifier in accordance with the gain control voltage signal;
   a current control unit configured to generate a current control signal for the first and second current generation units in accordance with the gain control voltage signal; and
   a load stage connected in series to a drain of the cascode amplifier and configured to output an output current, which is varied by the overall transconductance of the cascode amplifier, as a differential output voltage.

2. The CMOS variable gain amplifier of claim 1, wherein the first current generation unit comprises a pair of field effect transistors configured to receive the current control signal applied from the current control unit as a gate current and having a flowing current which decreases when the gate current decreases and increases when the gate current increases.

3. The CMOS variable gain amplifier of claim 1, wherein the second current generation unit comprises a field effect transistor configured to receive the current control signal applied from the current control unit as a gate current and having a flowing current which decreases when the gate current decreases and increases when the gate current increases.

4. The CMOS variable gain amplifier of claim 1, wherein the current control unit comprises:
   a first field effect transistor configured to receive a reference voltage as a gate voltage and have a constant gate voltage;
   a second field effect transistor configured to receive the gain control voltage signal as a gate voltage and form a common source with the first field effect transistor and having a flowing current which decreases when the gain control voltage signal increases and increases when the gain control voltage signal decreases;
   a first current mirror field effect transistor configured to apply the current of the second field effect transistor to the first current generation unit; and
   a second current mirror effect transistor configured to apply a current flowing in the first field effect transistor to the second current generation unit, the current increasing and decreasing in accordance with a difference between a source power supply current and the current which increases and decreases while flowing in the second field effect transistor.

5. The CMOS variable gain amplifier of claim 1, wherein the load stage comprises any one passive element of a resistor, an inductor, and a capacitor.

6. The CMOS variable gain amplifier of claim 1, wherein the load stage comprises any one active element of NMOS and PMOS transistors.

7. The CMOS variable gain amplifier of claim 6, wherein the load stage further comprises any one passive element of a resistor, an inductor, and a capacitor.

8. A CMOS variable gain amplifier comprising:
   a cascode amplifier comprising:
   an input stage comprising a pair of common source field effect transistors into which differential input voltage signals are differentially inputted in a triode region; and
   a cascode stage comprising a pair of common gate field effect transistors of which sources are cascode-coupled to drains of the pair of common source field effect transistors, respectively,
   wherein the cascode amplifier varies transconductance of the input stage in accordance with a gain control voltage signal applied as a common gate voltage of the cascode stage;
   a first current generation unit connected in parallel to a drain of the cascode stage and configured to vary a flowing current in accordance with the gain control voltage signal and control a current flowing into the cascode stage to vary transconductance of the cascode stage;
   a second current generation unit connected to a common source of the input stage and configured to vary a flowing current in accordance with the gain control voltage signal and control a bias current flowing in the cascode amplifier;
   a current control unit configured to generate a current control signal for the first and second current generation units in accordance with the gain control voltage signal; and
   a load stage connected in series to the drain of the cascode stage and configured to output an output current, which is varied by the overall transconductance of the cascode amplifier, as a differential output voltage.

9. The CMOS variable gain amplifier of claim 8, wherein the first current generation unit comprises a pair of field effect transistors configured to receive the current control signal applied from the current control unit as a gate current and having a flowing current which decreases when the gate current decreases and increases when the gate current increases.

10. The CMOS variable gain amplifier of claim 8, wherein the second current generation unit comprises a field effect transistor configured to receive the current control signal applied from the current control unit as a gate current and having a flowing current which decreases when the gate current decreases and increases when the gate current increases.

11. The CMOS variable gain amplifier of claim 8, wherein the current control unit comprises:
- a first field effect transistor configured to receive a reference voltage as a gate voltage and have a constant gate voltage;
- a second field effect transistor configured to receive the gain control voltage signal as a gate voltage and form a common source with the first field effect transistor and having a flowing current which decreases when the gain control voltage signal increases and increases when the gain control voltage signal decreases;
- a first current mirror field effect transistor configured to apply the current of the second field effect transistor to the first current generation unit; and
- a second current mirror effect transistor configured to apply a current flowing in the first field effect transistor to the second current generation unit, the current increasing and decreasing in accordance with a difference between a source power supply current and the current which increases and decreases while flowing in the second field effect transistor.

12. The CMOS variable gain amplifier of claim 8, wherein the load stage comprises any one passive element of a resistor, an inductor, and a capacitor.

13. The CMOS variable gain amplifier of claim 8, wherein the load stage comprises any one active element of NMOS and PMOS transistors.

14. The CMOS variable gain amplifier of claim 13, wherein the load stage further comprises any one passive element of a resistor, an inductor, and a capacitor.

* * * * *